(12) United States Patent
Novellini

(10) Patent No.: US 9,143,316 B1
(45) Date of Patent: Sep. 22, 2015

(54) NON-DISRUPTIVE EYE SCAN FOR DATA RECOVERY UNITS BASED ON OVERSAMPLING

(71) Applicant: Xilinx, Inc., San Jose, CA (US)

(72) Inventor: Paolo Novellini, Gorgonzola (IT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/323,680

(22) Filed: Jul. 3, 2014

(51) Int. Cl.
*H03L 7/081* (2006.01)
*H04L 7/033* (2006.01)
*H04L 27/233* (2006.01)
*H04L 27/22* (2006.01)

(52) U.S. Cl.
CPC .............. *H04L 7/0331* (2013.01); *H03L 7/081* (2013.01); *H04L 27/22* (2013.01); *H04L 27/2338* (2013.01)

(58) Field of Classification Search
CPC ............ H03L 7/08; H03L 7/081; H04L 27/22
See application file for complete search history.

(56) References Cited

U.S. PATENT DOCUMENTS

| | | | | |
|---|---|---|---|---|
| 5,892,631 | A * | 4/1999 | Howell et al. | 360/51 |
| 7,039,149 | B2 * | 5/2006 | Tagami | 375/376 |
| 7,142,621 | B2 * | 11/2006 | Vallet et al. | 375/355 |
| 7,397,848 | B2 * | 7/2008 | Stojanovic et al. | 375/229 |
| 8,081,723 | B1 * | 12/2011 | Ding et al. | 375/355 |
| 8,666,010 | B1 | 3/2014 | Novellini | |
| 8,761,325 | B2 * | 6/2014 | Willcocks et al. | 375/355 |
| 8,958,513 | B1 * | 2/2015 | Novellini et al. | 375/355 |
| 2002/0186159 | A1 * | 12/2002 | Reinhold et al. | 341/155 |
| 2005/0002475 | A1 * | 1/2005 | Menolfi et al. | 375/340 |
| 2005/0058234 | A1 * | 3/2005 | Stojanovic | 375/371 |
| 2005/0259764 | A1 * | 11/2005 | Hung Lai et al. | 375/317 |
| 2006/0227912 | A1 * | 10/2006 | Leibowitz et al. | 375/350 |
| 2010/0253400 | A1 * | 10/2010 | Lai et al. | 327/156 |
| 2011/0043253 | A1 * | 2/2011 | O'Keeffe et al. | 327/12 |

OTHER PUBLICATIONS

Novellini, Paolo et al., *Dynamically Programmable DRU for High-Speed Serial I/O*, XAPP875 (v1.1), Jan. 13, 2010, pp. 1-14, Xilinx, Inc., San Jose, California, USA.

Novellini, Paolo et al., *Fractional Burst Clock Data Recovery for XG-PON Application*, XAPP1083 (v1.0.1), Jun. 17, 2013, pp. 1-19, Xilinx, Inc., San Jose, California, USA.

\* cited by examiner

*Primary Examiner* — Jean B Corrielus
(74) *Attorney, Agent, or Firm* — Gerald Chan

(57) ABSTRACT

A data recovery unit includes a phase locked loop configured to receive data samples and generate an output; a first sample selector coupled to the phase locked loop; and an eye scanner coupled to the phase locked loop. The first sample selector is configured to receive the data samples and the output of the phase locked loop. The eye scanner comprises a second sample selector coupled to the phase locked loop via a first horizontal shift module.

19 Claims, 9 Drawing Sheets

NON-DISRUPTIVE EYE SCAN FOR DATA RECOVERY UNITS BASED ON OVERSAMPLING

TECHNICAL FIELD

The subject disclosure relates to signal processing and data recovery units.

BACKGROUND

Digital data recovery units (DRUs), also known as clock and data recovery units (CDRs), are used in many applications, such as serializer/deserializer (SerDes) applications, for recovering data from noisy or high-jitter environments. To perform data recovery, the data may be oversampled (e.g., using a SerDes) and sent to the DRU over multiple parallel input wires. The DRU then selects and outputs the best sample for each data bit, by detecting transitions in the oversampled data. In particular, when a DRU operates on oversampled data, there may be more samples per unit interval (UI) and the samples may be taken asynchronously with respect to the incoming bit stream. In some cases, only one sample per bit may be the one closest to the middle of an eye, and the DRU may select that sample as the best sample.

In some cases, the samples of parallel input data transmitted to a DRU may be superimposed to form an eye, with the transitions in the incoming data representing edges of the eye. In order to select the best sample and avoid bit errors, the DRU may oversample the data, and select the sample that is located the closest to the center of the eye. In order to qualify the incoming data, it may be desirable to determine the width of the eye. However, the width of the eye typically cannot be measured during operation of the DRUs without affecting data traffic being processed by the DRUs.

SUMMARY

A data recovery unit includes a phase locked loop configured to receive data samples and generate an output; a first sample selector coupled to the phase locked loop, and an eye scanner coupled to the phase locked loop. The first sample selector is configured to receive the data samples and the output of the phase locked loop. The eye scanner comprises a second sample selector coupled to the phase locked loop via a first horizontal shift module.

A method performed by a data recovery unit includes receiving data samples using a phase locked loop; generating an output by the phase locked loop based at least in part on the data samples; processing the output of the phase locked loop, using a first sample selector, to obtain a data recovery unit output; transmitting the output of the phase locked loop to a second sample selector through a first horizontal shift module that provides a first phase shift to the output of the phase locked loop; and comparing an output of the first sample selector to an output of the second sample selector.

Other aspects and features will be evident from reading the following detailed description.

BRIEF DESCRIPTION OF THE DRAWINGS

The drawings illustrate the design and utility of various examples, in which similar elements are referred to by common reference numerals. These drawings are not necessarily drawn to scale. In order to better appreciate how the above-recited and other advantages and objects are obtained, a more particular description is rendered of the examples illustrated in the accompanying drawings. These drawings depict only examples, and are not therefore to be considered limiting of the scope of the claims.

DETAILED DESCRIPTION

Figure 1:
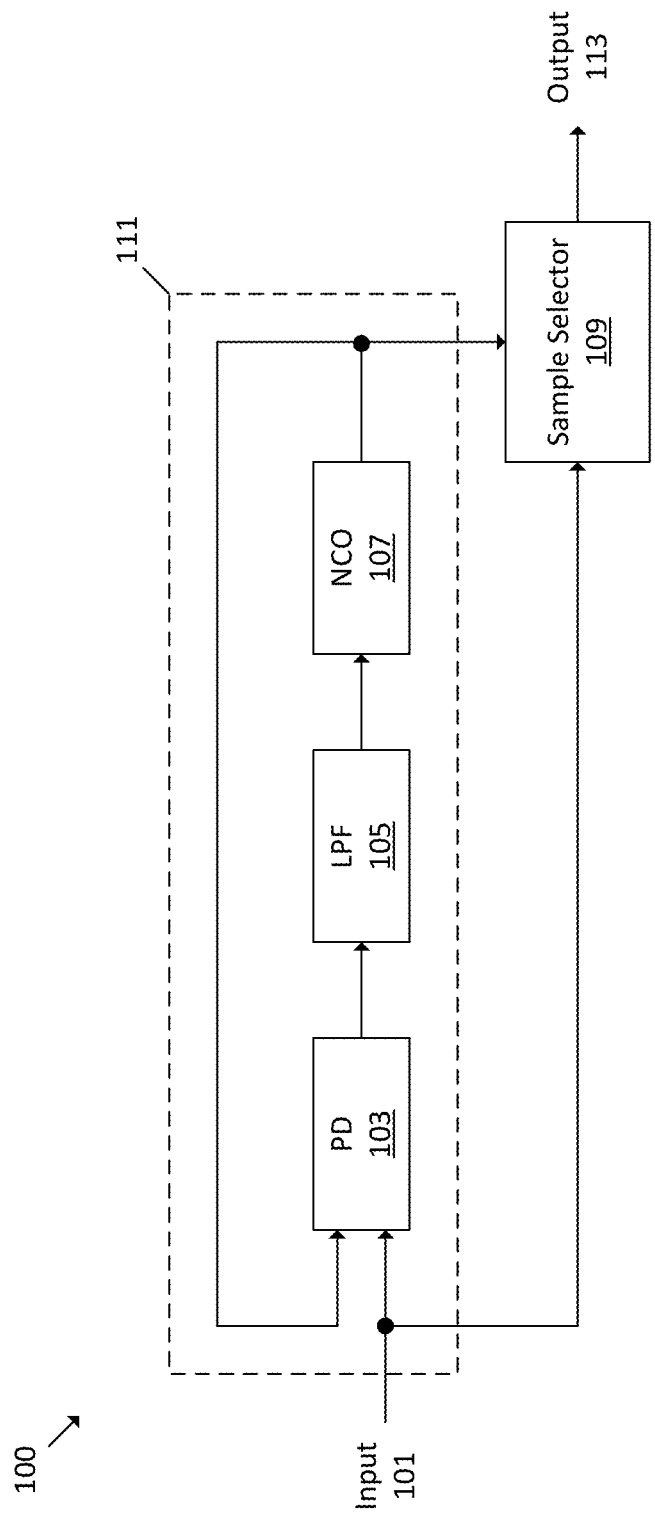
FIG. 1 illustrates a first data recovery unit (DRU).

Various features are described hereinafter with reference to the figures. It should be noted that the figures are not drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example needs not have all the aspects or advantages shown. An aspect or an advantage described in conjunction with a particular example is not necessarily limited to that example and can be practiced in any other examples, even if not so illustrated, or if not explicitly described.

A data recovery unit (DRU) with eye scanning capability is provided. The DRU includes: a phase locked loop configured to receive data samples and generate an output; a first sample selector coupled to the phase locked loop, wherein the first sample selector is configured to receive the data samples and the output of the phase locked loop; and an eye scanner coupled to the phase locked loop, wherein the eye scanner comprises a second sample selector coupled to the phase locked loop via a first horizontal shift module. The DRU can output a desired selected sample at or near a center of an eye, while the eye scanner performs an eye scan. The DRU is advantageous because the eye scan can be performed by the eye scanner without disrupting data traffic that are being processed by other components of the DRU.

FIG. 1 illustrates a DRU 100. DRU 100 is configured to receive, as input, incoming data (data samples) 101 sent over a plurality of parallel wires. In some cases, the incoming data 101 may be sent from a serializer that samples data at high speed and split into parallel wires. For examples, in some cases, in order to oversample incoming data, a serializer/deserializer (SerDes) may be used. When using the SerDes to sample data for the DRU 100, clock and data recovery is disabled so that the SerDes does not track transitions in the incoming data, and simply samples the incoming data in free running mode (e.g., lock-to-reference mode). In other cases, a SelectIO (i.e., a programmable input/output block) may be used to oversample incoming data. In some cases, the DRU 100 may be fractional in nature, wherein the ratio between the frequency of the clock involved in the oversampling of the data and the frequency of the data itself may be any fractional number. For example, the fractional number may be greater than two, or other numbers. The oversampling ratio may be any number. For example, an incoming data may have a rate of 100 Mbit/second and may be oversampled at 550 MHz. In such example, the oversampling ratio is 5.5. In other cases, the incoming data may be received at other rates, and the oversampling may be at other values. In some cases, the incoming data 101 may be processed to form an eye diagram. An example of an eye diagram is described below with reference to FIG. 3-1.

As shown in the figure, the DRU 100 includes a phase-locked loop (PLL) 111 and a sample selector 109. The PLL 111 is used to set a sampling time for the sample selector 109, so that the sample selector 109 is able to select the best sample (e.g., one or more samples near the middle of an eye) from the incoming data 101. The samples selected by the sample selector 109 are then output as output data 113.

The PLL 111 includes a phase detector (PD) 103, a low-pass filter (LPF) 105 coupled to the PD 103, and a numerically-controlled oscillator (NCO) 107 coupled to the LPF 105. The PD 103 is configured to receive two input signals, i.e., the incoming data 101 and an output from the NCO 107, and provide an output signal that is proportional to the phase difference between the two input signals. In some cases, the PD 103 may be configured to generate the output signal by detecting transitions in the two input signals. The output signal of PD 103 is then passed to the LPF 105.

The LPF 105 is configured to receive, as input, the output signal from the PD 103, and filter the output signal from the PD 103 to generate a filtered signal. The filtered signal is then passed to the NCO 107. In some cases, the LPF 105 is configured to take, as input, a number at each clock cycle from the PD 103, and generate an output. The number from the PD 103 may represent phase difference or phase error. In some cases where the DRU 100 has one pole, the output may be obtained by multiplying the input by a factor. In other cases where the DRU 100 has two poles, the output of the LPF 105 may be obtained by multiplying the input by a factor to obtain a factored input, and adding a mathematical integral of the input to the factored input.

Figure 2:
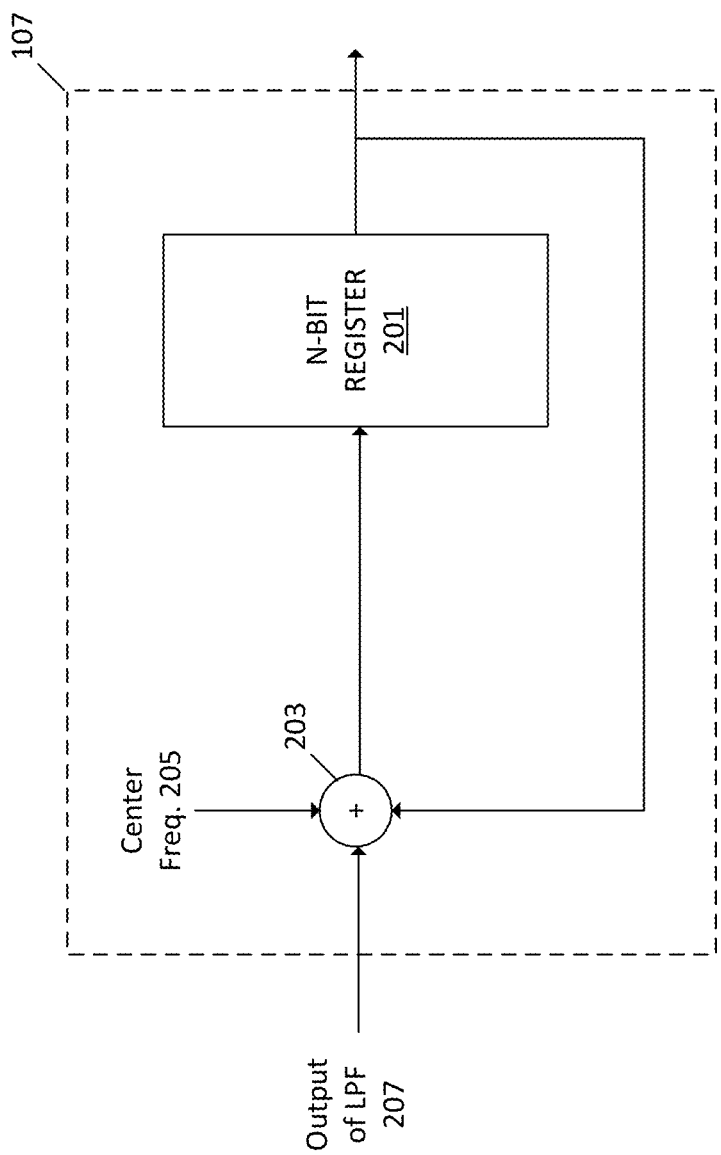
FIG. 2 illustrates a numerically-controlled oscillator.

The NCO 107 is configured to track the phase and frequency of incoming data 101. The tracking of the incoming data by the NCO 107 is controlled by the PLL 111, which drives the NCO 107 at the correct phase and frequency. In some cases, the NCO 107 is configured to oscillate at a fixed rate and is steered over time based on a filtered phase error. The phase error is then driven to zero to thereby allow the NCO 107 to track the incoming data. Also, in some case, the NCO output phase is aligned with the incoming data. This means that, if here is a transition in the incoming data, the output phase of the NCO 107 is approximately −180 degrees or +180 degrees. FIG. 2 illustrates an example of the NCO 107. The NCO 107 comprises a N-bit register 201 and a summation module 203. The summation module 203 is configured to receive, as inputs, an output 207 (which may be an output of the LPF 105 in FIG. 1), a center frequency 205, and an output from the N-bit register 201. The N-bit register is configured to receive, as input, an output from the summation module 203.

During use, at the first clock cycle, the summation module 203 receives the center frequency value 205 and the output 207 from the LPF 105, and adds the two signals to generate an output. The output is passed to the N-bit register for storage. At subsequent clock cycle(s), the summation module 203 receives the center frequency value 205 and the output 207 from the LPF 105, as well as an output (e.g., a value of N-bit register 201) from the N-bit register 201, and adds the three signals to generate an output. Thus, at every clock cycle, the value of the N-bit register 201 increases by the values of the center frequency value 205 and the output 207 of the LPF 105. When the N-bit register 201 is full, it resets. Thus, the value stored in the N-bit register 201 grows and resets, forming an oscillating signal. In some cases, the rate of oscillation may be based upon the values of the center frequency value 205 and the output 207 of the LPF 105 relative to the size of the N-bit register 201.

Figure 3A:
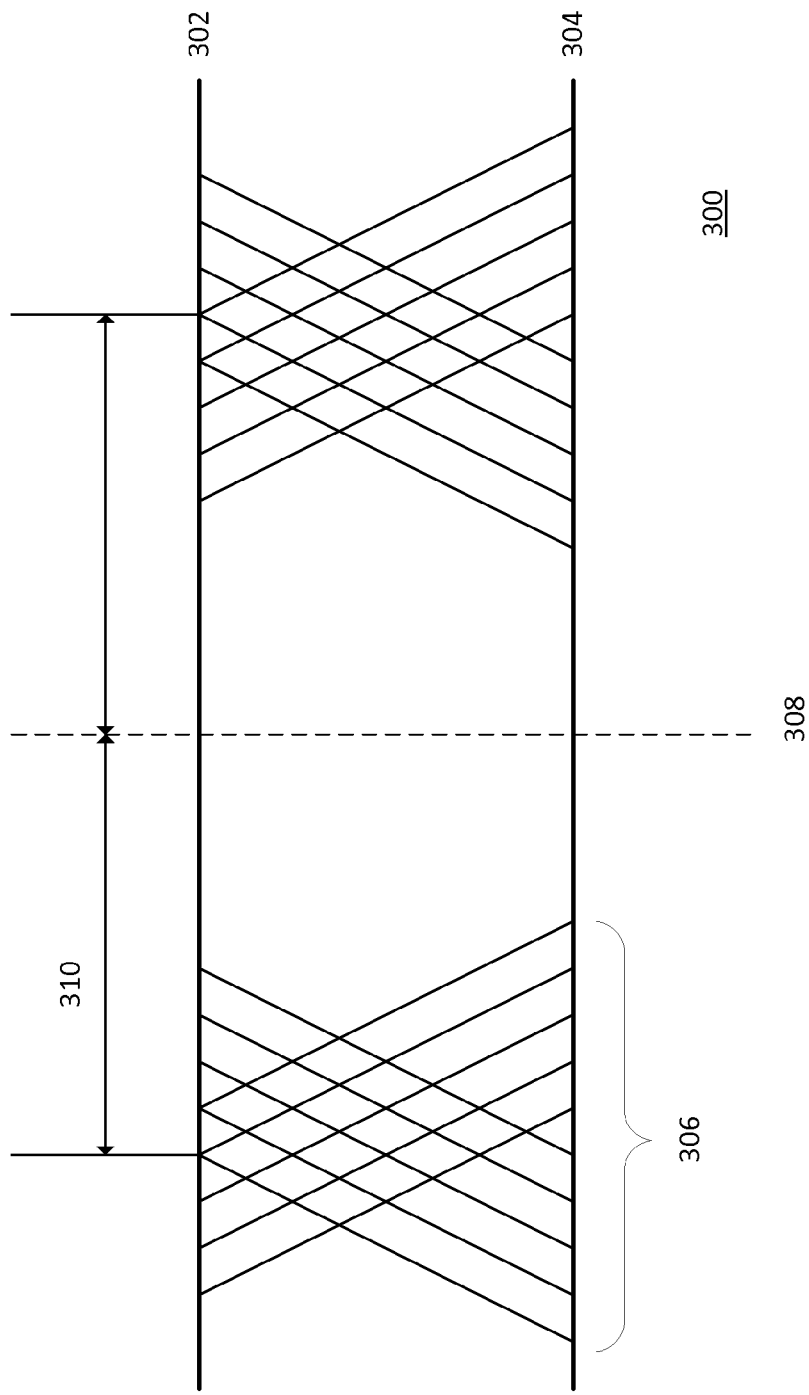
FIGS. 3A and 3B illustrate examples of eye diagrams.
Figure 3B:
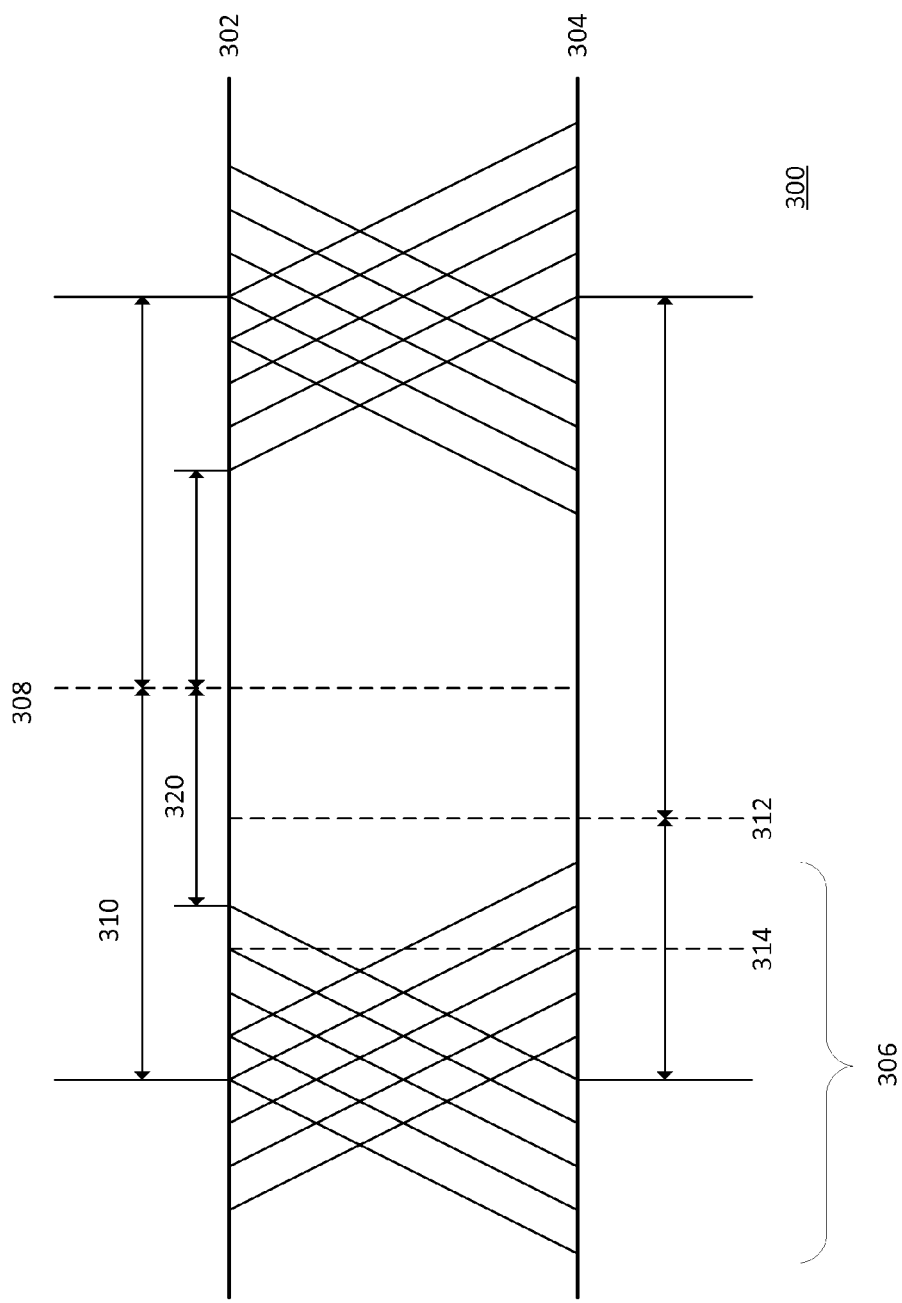

The center frequency value 205 may be a user-defined value or vector that represents the oscillating frequency of the NCO 107. In some cases, the output 207 of the LPF 105 may be relatively small compared to the center frequency value 205. In such cases, the oscillation frequency of the NCO 107 may be determined primarily by center frequency value 205. Also, in some cases, the center frequency value 205 may depend on a ratio between incoming data frequency and clock frequency of the DRU 100. Thus, a user may be able to change the frequency at which the DRU 100 operates by adjusting the center frequency value 205 in order to match the frequency of incoming data 101. In some cases, the center frequency value 205 may cause the value of N-bit register 201 to linearly increase in value. In addition, in some cases, the oscillation frequency of the NCO 107 may be referred to as a "line rate", and the center frequency value 205 is configured to control a line rate at which the DRU 100 operates Returning to FIG. 1, the sample selector 109 is configured to receive the output of the NCO 107 of the PLL 111, associate a phase to each sample of the incoming data 101, and extract the samples from the incoming data that have an associated phase close to the middle of an eye based on the output from the NCO 107. In some cases, the sample(s) extracted by the sample selector 109 may correspond to the value received from the NCO 107. It should be noted that inside the data eye, there are many samples because the incoming data 101 are oversampled. In order to determine and extract a sample that is closely located to the center of the eye, each sample is associated with a phase, and the sample with the phase that is the closest to an ideal mid-phase is extracted by the sample selector 109. FIG. 3-1 illustrates an example of an eye diagram for an eye 300. In digital systems, the eye 300 is defined by high voltage level 302 and low voltage level 304, and the edges of the eye 300 are defined by the transitions 306 of the incoming data 101 (with jitter). During operation, the sample selector 109 selects a sample at the center of the eye, represented by line 308, which is separated from the position of the edges (transitions 306) by margin 310. As long as sample selector 109 selects samples near the center of the eye (e.g., near line 308 in the example of the eye 300), the sampled data will be free of bit errors. However, if samples are taken closer to the edges of the eye 300 (e.g., near transitions 306), bit errors may be experienced. The amount of bit errors may increase the further the sample is from the center 308, due to the jitter of the incoming data 101.

In some cases, an eye scanner may be configured to perform an eye scan to determine a width of an eye (e.g., the eye 300). The eye scanner may include a phase shift module and a detector. To determine a width of the eye 300, the phase shift module may shift a sampling phase horizontally to either side of the eye 300. When the sampling phase is shifted near the edge of the eye (e.g., near transitions 306), bit errors may be detected by the detector of the eye scanner. Thus the margin 310 between the center of the eye (corresponding to line the 308) and the edges (corresponding to the transitions 306) may be determined by horizontally shifting the sampling phase to different positions, and measuring the occurrences of bit errors.

FIG. 3-2 illustrates shifting a sampling phase to determine a width of the eye 300. When the sampling phase shifter shifts the sampling phase to near the line 308, corresponding to the center of the eye, no bit errors will be detected by the detector. If the phase shift module shifts the sampling phase horizontally to near line 312, no bit errors will be detected by the detector despite the sampling phase being away from the line 308. This is because the sampling phase at the line 312 is still not near the transitions 306. However, if the phase shift module shifts the sampling phase to line 314, for example, bit errors will be detected by the detector, due to the sampling phase at the line 314 being within the range of transitions 306. In the illustrated example, the width of the eye 300 may be two times the distance 320 from the line 308 to the transitions 306 on one side of the eye 300. In other example, the width of the eye 300 may be the distance 320 from the line 308 to the transitions 306.

Figure 4:
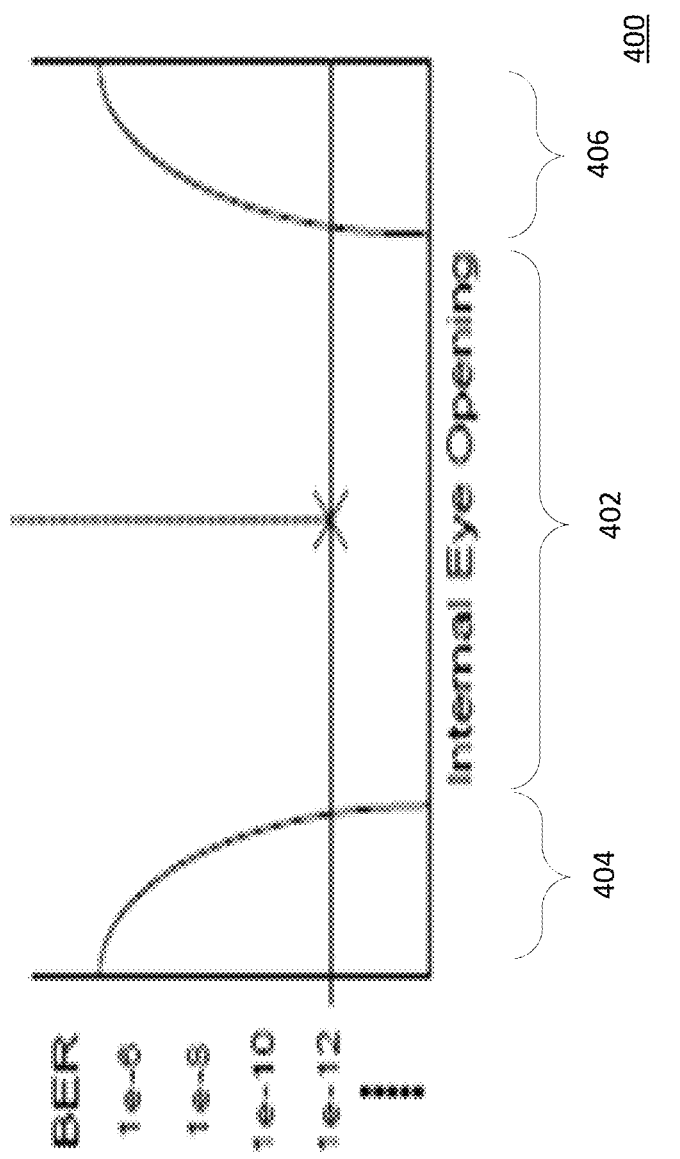
FIG. 4 illustrates a bit error rate graph.

In some cases, by shifting the sampling phase horizontally in both directions of an eye during the eye scan, a bit error plot may be obtained. FIG. 4 illustrates a bit error plot 400 that may be obtained by shifting a sampling phase in an eye. In some cases, the bit error plot 400 may be generated using a processor based on input from the phase shift module and the bit errors detector. The bit error plot 400 includes a central region 402 having no detected bit errors, corresponding to the region of the eye 300 away from the transitions 306 of the incoming data. The bit error plot 400 also includes regions 404, 406, which represent detections of bit errors at the transitions 306 of the incoming data. The horizontal line in the plot 400 represents 100% of the unit interval (UI). In the illustrated example, the width of the region 402 may be considered an example of a width of the eye. Accordingly, the width of the eye may be determined by measuring the bit error occurrences associated with different horizontal phase shifts.

In some cases, the amount of bit errors measured at a particular sampling phase may be referred to as how open the eye is (e.g., an "openness" of the eye). For example, central region 402 of the eye may be referred to as being fully open, due to no bit errors being detected in that area of the eye.

Figure 5A:
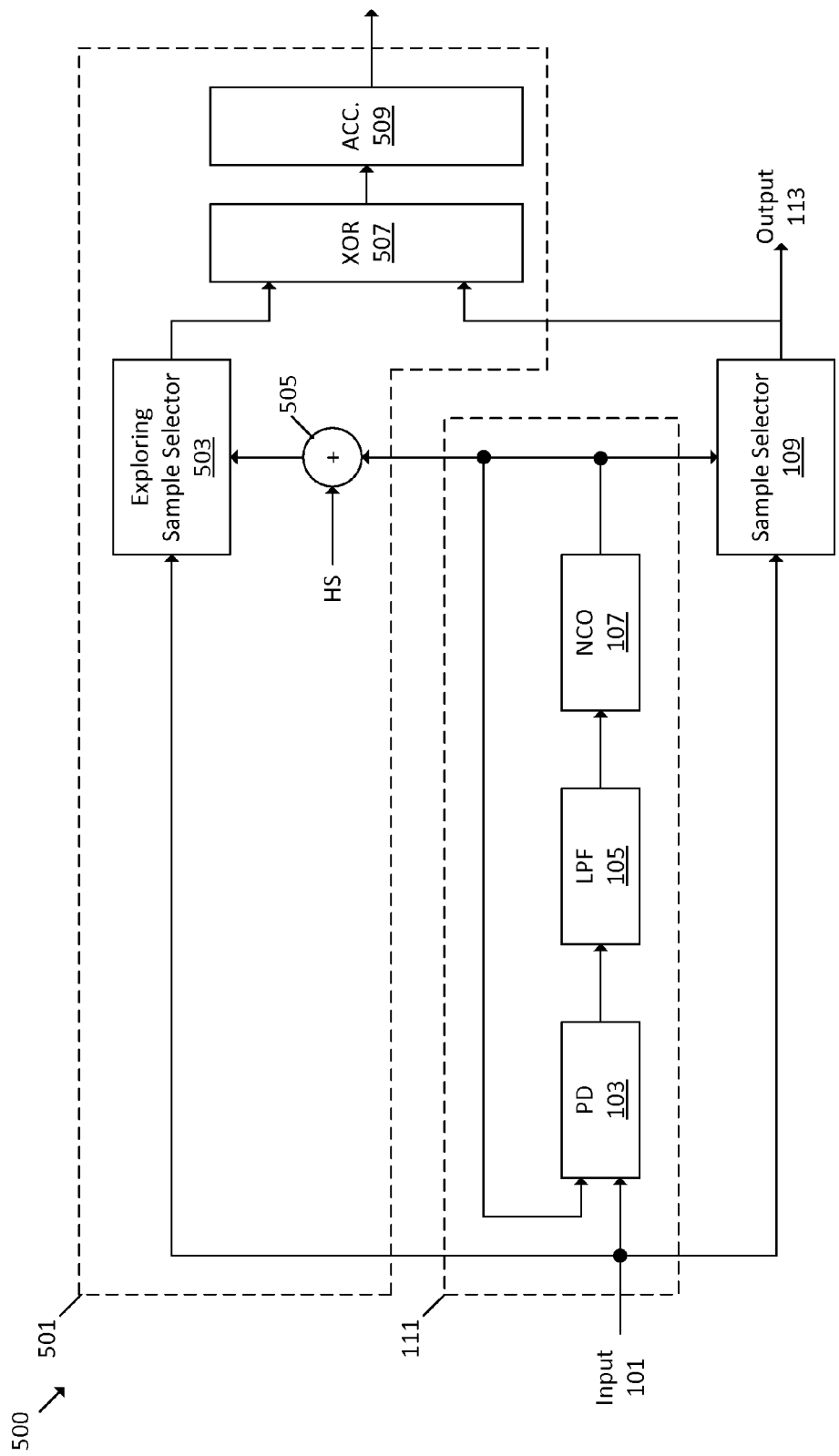
FIG. 5A illustrates a second DRU.
Figure 5B:
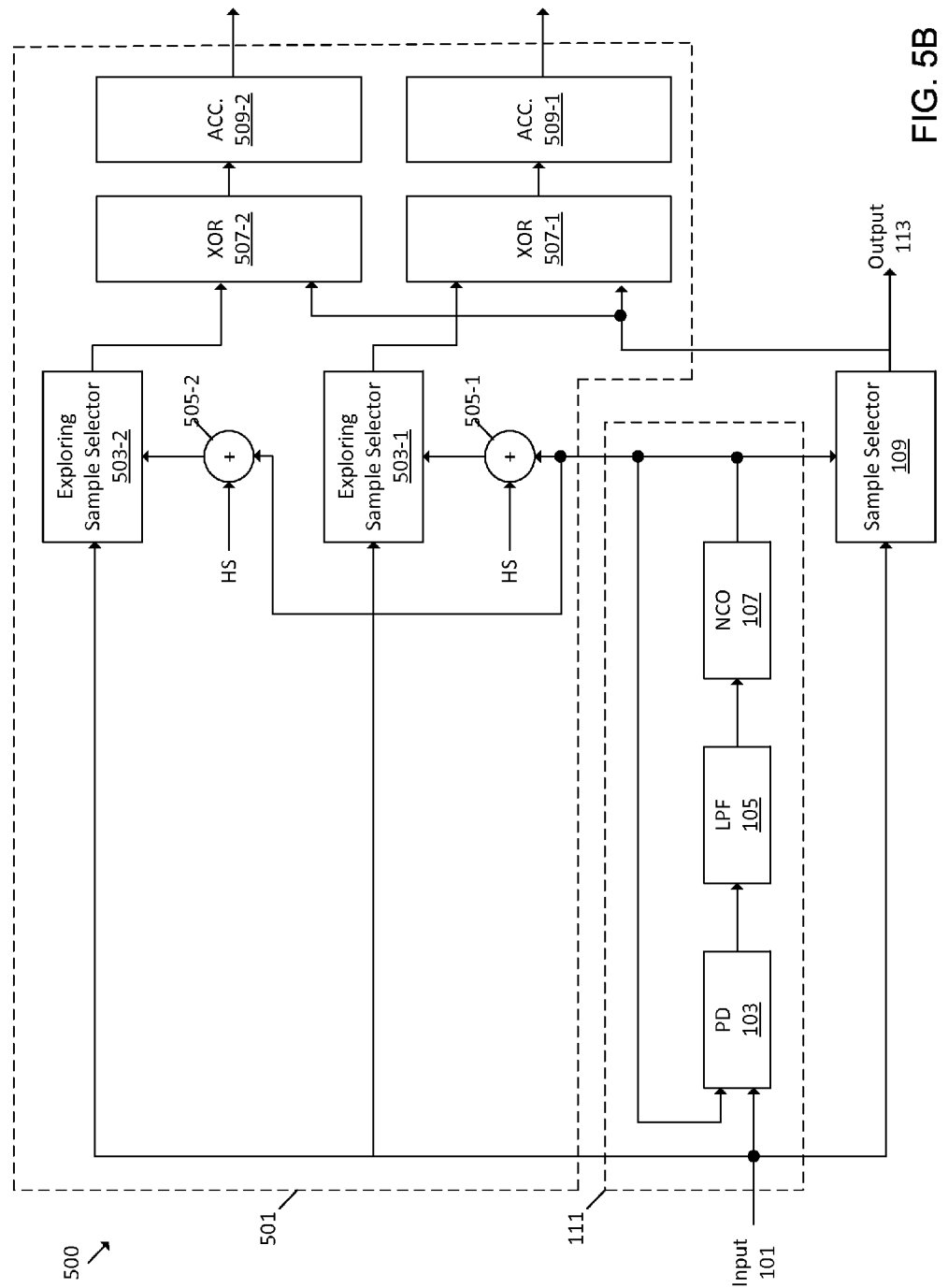
FIG. 5B illustrates a third DRU.

Because performing an eye scan involves shifting the sampling phase to detect bit errors, the eye scan may not be performed on a DRU without disrupting data traffic. For example, if eye scan is performed on a DRU, it may introduce bit errors to the output of the DRU. FIG. 5-1 illustrates a DRU 500 having the ability to perform non-disruptive eye scans. In the illustrated example, the DRU 500 contains functionality to perform eye scans without affecting the data traffic, so that output data from the DRU 500 is free from bit errors. The DRU 500 may be fractional in nature, wherein the ratio between the frequency of the clock involved in the oversampling of the data and the frequency of the data itself may be any fractional number. For example, the fractional number may be greater than two, or other numbers. In other cases, the DRU 500 may not be fractional in nature.

Similar to the DRU 100 of FIG. 1, the DRU 500 includes a PLL 111 and a sample selector 109 coupled to the PLL 111. The PLL 111 is configured to receive incoming data (data samples) 101 and generate an output. The sample selector 109 is configured to also receive the incoming data 101 and the output from the PLL 111. The PLL 111 is used to set a sampling time for the sample selector 109, so that the sample selector 109 is able to select the best sample (e.g., one or more samples near the middle of an eye) from the incoming parallel data 101. The samples selected by sample selector 109 are then output as output data 113. In some cases, a frequency of the sample selector 109 to a frequency of a line rate of the DRU 500 may be fractional. In other cases, the frequency of the sample selector 109 to a frequency of a line rate of the DRU 500 may not be fractional.

The PLL 111 includes a PD 103, an LPF 105 coupled to the PD 103, and an NCO 107 coupled to the LPF 105. The PD 103 is configured to receive two input signals, i.e., the incoming data 101 and an output from the NCO 107, and provide an output signal that is proportional to the phase difference between the two input signals. In some cases, the incoming data 101 may be received by the PD 103 through a plurality of parallel wires. For example, in some cases, incoming data 101 may be sent from a serializer that samples data at high speed and split into parallel wires. In some cases, the PD 103 may be configured to generate the output signal by detecting transitions in the two input signals. The output signal of PD 103 is passed to the LPF 105. The LPF 105 is configured to filter the output signal from the PD 103 to generate a filtered signal. The filtered signal is then passed to the NCO 107. The NCO 107 is configured to track the phase and frequency of incoming data 101. The first sample selector 109 is configured to select one or more samples from the incoming data 101 that correspond to a region near the middle of the eye based on output from the NCO 107 of the PLL 111. It should be noted that the PLL 111 is not limited to the configuration and features described, and that the PLL 111 may have other configurations and/or features in other cases.

Unlike the DRU 100 of FIG. 1, the DRU 500 further includes an eye scanner 501 coupled to the PLL 111. The eye scanner 501 includes a second sample selector 503 (which may also be referred to as an exploring sample selector) that is coupled to the PLL 111 via a horizontal shift module 505. The second sample selector 503 is configured to receive incoming data 101, and select a sample corresponding to the output of the PLL 111 offset by a horizontal shift (a phase shift) HS. In some cases, the amount of horizontal (or phase) shift may be defined at the horizontal shift module 505, and be provided by the horizontal shift module 505 during use. For example, a pre-defined range of phase shift values may be defined at the horizontal shift module 505. Also, in some cases, the amount of horizontal shift may be expressed in degrees or other units. The second sample selector 503 is configured to "explore" the eye by sampling at different areas of the eye based on different amounts of the horizontal shift. In some cases, a frequency of the second sample selector 503 to a frequency of a line rate of the DRU 500 may be fractional. In other cases, the frequency of the second sample selector 503 to the frequency of the line rate of the DRU 500 may not be fractional.

In some cases, the amount of the horizontal shift may be user-defined, and may have a ranged based upon the configuration of the NCO 107. For example, if the N-bit register in the NCO 107 has 16 bits, the horizontal shift may have up to 2^16 different values for which to "explore" the eye of the incoming data. In other cases, the amount of the horizontal shift may be dynamically determined by a control circuit. The amount of the horizontal shift may be stored in a medium in some cases.

As shown in the figure, the eye scanner 501 further includes an XOR unit 507 and an accumulator 509 coupled to the XOR unit 507. The XOR unit 507 has a first input coupled to an output of the first sample selector 109, and a second input coupled to an output of the second sample selector 503. The XOR unit 507 is configured to compare the samples selected by the first sample selector 109 and the second sample selector 503 in order to identify any bit errors in the output of the second sample selector 503. Thus, the XOR unit 507 functions as a bit errors detector. Because the first sample selector 109 is configured to select samples at the center of the eye, any discrepancies between the samples of the first sample selector 107 and the samples of the second sample selector 503 may be identified as bit errors.

In some cases, once a particular horizontal shift value is selected, the second sample selector 503 may be kept at that particular horizontal shift value for a plurality of clock cycles in order to allow for bit errors to accumulate. The number of clock cycles for which to keep the second sample selector 503 at a particular horizontal shift value may be selected based upon a desired bit error rate (BER) to be detected. For example, if it is desired to detect a BER of 1e-9 (e.g., a rate of 1 bit error per billion samples), then the second sample selector 503 may be kept at the selected horizontal shift for several billion clock cycles. After the specified number of clock cycles has passed, the horizontal shift may be changed to a different value, in order to measure BERs for other horizontal shift values. In some cases, a different horizontal shift value may be input by a user, or be provided by the phase shift module 505, after the specified number of clock cycles has passed. In other cases, a control circuit (which may or may not be a part of the phase shift module 505) may be configured to automatically step through a number of pre-defined horizontal shift values during the eye scan.

The accumulator 509 is configured to store and accumulate detected bit errors. The accumulator 509 may be any type of storage device, such as a register. At the beginning of each eye scan, the accumulator 409 may be reset by a user or a control circuit. During an eye scan, bit errors are detected over a specified number of clock cycles, and the detected bit errors are accumulated at the accumulator 509 for the specified number of clock cycles. After the specified number of clock cycles has passed, the number of bit errors accumulated at the accumulator 509 may then be outputted. The number of bit errors stored at the end of each measurement is indicative of the how much the eye is open at the position defined by the horizontal shift. For example, if the number of bit errors stored is zero for a measurement taken at a certain horizontal shift, then the eye is fully open at that horizontal shift position. In some cases, output from the accumulator 509 may be passed to a processing unit. The processing unit may process the output from the accumulator 509 to generate an eye diagram, such as that described with reference to FIG. 3-2. In other cases, the processing unit may process the output from the accumulator 509 to generate a graph representing an eye, such as that described with reference to FIG. 4. Also, in some cases, the eye diagram and/or the graph generated by the processing unit may be displayed on a screen for presentation to a user. In further cases, the processing unit may process the output from the accumulator 509 to determine one or more features of the eye. By means of non-limiting examples, the feature(s) may be a width of the eye, an openness of the eye, etc., or any combination thereof.

In some cases, the eye scanner 501 may be fully synchronized to a single clock with other components of the DRU 500. Such configuration allows the DRU 500 to be fully portable across different digital architectures (e.g., FPGAs, ASICs, or any integrated circuits, etc.).

As illustrated in the above exemplary DRU 500, the DRU 500 is advantageous because the sample selector 109 can output a desired selected sample at or near a center of an eye, while the eye scanner 501 performs an eye scan simultaneously. The DRU 500 is also advantageous because the eye scan can be performed by the eye scanner 501 without disrupting data traffic that are being processed by the PLL 111 and the sample selector 109.

As described above, the DRU 500 has an eye scanner 501 with a sample selector 503. In other cases, the eye scanner 501 of the DRU 500 may have multiple sample selectors 503. For example, as shown in FIG. 5-2, the eye scanner 501 of the DRU 500 may include multiple sample selectors 503, multiple horizontal shift modules 505, multiple XOR units 507, and multiple accumulators 509. In the illustrated example, there are two sample selectors 503 (e.g., second sample selector 503-1, and third sample selector 503-2), two horizontal shift modules 505 (e.g., first horizontal shift module 505-1, and second horizontal shift module 505-2), two XOR units 507 (e.g., first XOR unit 507-1, and second XOR unit 507-2), and two accumulators 509 (e.g., first accumulator 509-1, and second accumulator 509-2). The multiple sets (e.g., two in the example) of the sample selectors 503, horizontal shift modules 505, XOR units 507, and the accumulators 509 are connected in parallel. In other cases, the sets of the sample selectors 503, horizontal shift modules 505, XOR units 507, and accumulators 509 may be more than two.

As shown in FIG. 5-2, The third sample selector 503-2 is configured to receive the data samples 101, and is coupled to the output of the phase locked loop 111 via a second horizontal shift module 505-2. The second horizontal shift module 505-2 is configured to provide a phase shift that is different from a phase shift provided by the first horizontal shift module 505-1. Also, the second XOR unit 507-2 has a first input coupled to an output of the first sample selector 109 and a second input coupled to an output of the third sample selector 503-2. The second accumulator 509-2 is coupled to the second XOR unit 507-2.

During use, the eye scanner 501 is configured to receive samples of incoming data at respective horizontally shifted sampling phases that are different from each other. This type of configuration may be used to reduce the amount of time needed to wait for errors to accumulate between each change of the horizontal phase shift. For example, as shown in FIG. 5-2, if the eye scanner 501 includes two exploring sample selectors 503, the amount of clock cycles needed to detect a given BER may be halved. This is because the eye scanner 501 of FIG. 5-2 has two XOR units 507-1, 507-2 that correspond with the respective sample selectors 503-1, 503-2. Accordingly, the two XOR units 507-1, 507-2 can simultaneously detect bit errors for the different shifted sampling phases. This is twice as fast as using a single XOR unit 507 to sequentially detect bit errors for the two different shifted sampling phases.

Figure 6:
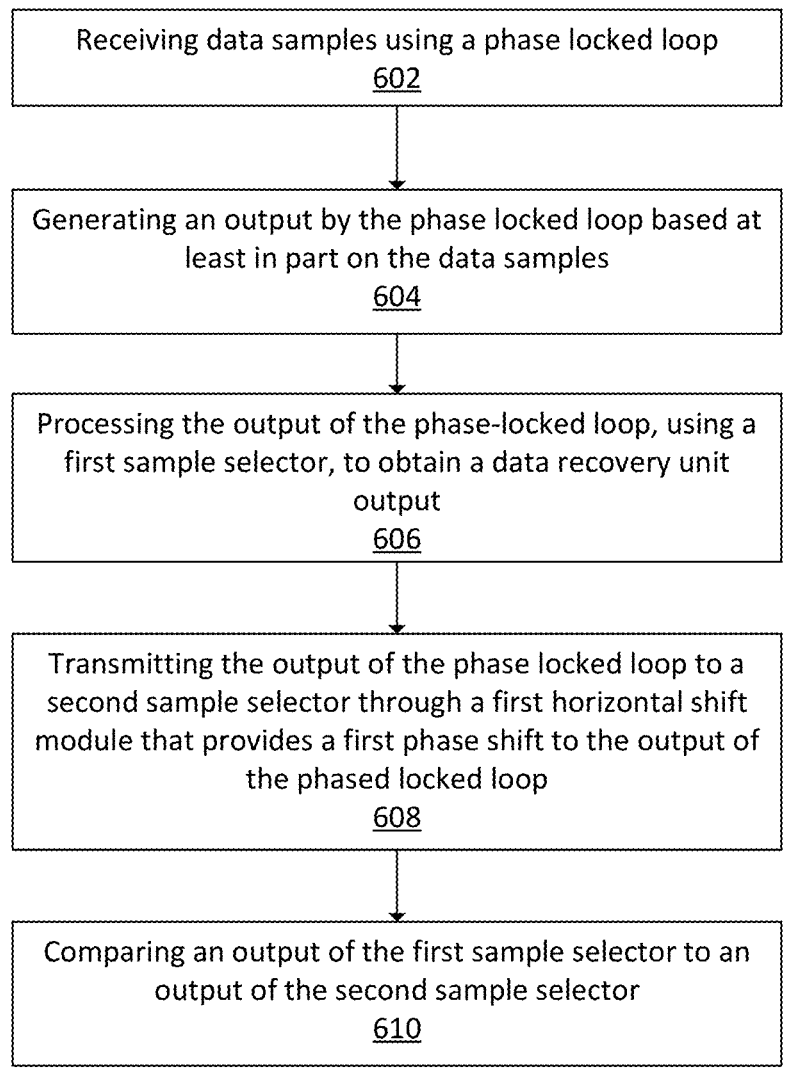
FIG. 6 illustrates a method for performing an eye scan.

FIG. 6 illustrates a method 600 for performing an eye scan. At item 602, data samples are received using a phase locked loop. In some cases, item 602 may be performed by the PLL 111 in the DRU 500, which received the data samples through a number of parallel wires.

Next, the phase locked loop generates an output based at least in part on the data samples (item 604). In some cases, item 604 may be performed by the PLL 111 in the DRU 500. Also, in some cases, the PLL 111 analyzes the transitions of the incoming parallel data and, using an oscillator, outputs a numeric phase corresponding to a center of the eye of the incoming data. As discussed with reference to FIG. 5-1/5-2, in some cases, the act of generating the output by the PLL 111 may include processing the incoming data 101 by the PD 103 to generate an output, filtering the output from the PD 103 using the LPF 105 to obtain a filtered output, and generating the PLL output based on the filtered output from the LPF 105.

Next, at item 606, a first sample selector processes the output of the phase locked loop to obtain a data recovery unit output. In some cases, the act of obtaining the data recovery unit output may be performed by the sample selector 109 in the DRU 500 of FIG. 5-1/5-2. In particular, the sample selector 109 may select a sample of the incoming data 101 near the center of the eye based on the output of the PLL 111. Because the sample is near the center of the eye of the incoming data, the data will not experience any bit errors, and may be used by a user or transmitted to other components for further processing.

At item 608, the output of the phase-locked loop is transmitted to a second sample selector through a first horizontal shift module that provides a first phase shift to the output of the phase locked loop. In some cases, item 608 may be performed by the NCO 107 of the PLL 111 in the DRU 500 of FIG. 5-1/5-2, which transmits the output of the NCO 107 to the second sample selector 503.

At item 610, an output of the first sample selector is compared to an output of the second sample selector. In some cases, item 610 may be performed by the XOR unit 507 based on output from the sample selector 109 (being the first sample selector) and output from the second sample selector 503 in the DRU 500 of FIG. 5-1/5-2. In particular, the second sample selector 503 may select a sample from the input data 101 based upon a sampling phase horizontally shifted from the center of the eye. The amount of phase shift may be based upon a horizontal shift value specified at the horizontal shift module 505. The output of the first sample selector 109 corresponds to the center of the eye. Accordingly, if the output of the first sample selector 109 is different from the output of the second sample selector 503, then such comparison results may represent bit errors. For example, if the sampling phase of the second sample selector 503 is not near the edges of the eye corresponding to transitions in the incoming data 101, then no bit errors will be detected. However, if the sampling phase of the second sample selector 503 is near the edge of the eye, bit errors may be detected. Accordingly, item 610 may be performed using the XOR unit 507 in the DRU 500 in order to identify any bit errors in the output of the second sample selector 503. In some cases, each of the sample selectors 109, 503 extracts bits, which are then compared. For each horizontal shift value, bit differences are determined and are counted. If there are no differences at a given horizontal shift value, that means the eye is "open up" for that horizontal shift value. In some cases, samples over a large number of clock cycles are compared by the XOR unit 507 in order to detect a certain bit error rate. In this way, the width of the eye can be calculated based upon the amount of horizontal shift and a detected bit error rate.

In some cases, the method may optionally further include accumulating a number of the detected bit errors. Such may be performed using the accumulator 509 as discussed with reference to FIGS. 5-1 and 5-2. Also, in some cases, the method may optionally further include determining a feature of an eye based on a result from the act of comparing. By means of non-limiting examples, the feature may be a width of the eye, an openness of the eye, etc. Furthermore, in some cases, the method may optionally further include transmitting the output of the phase locked loop to a third sample selector through a second horizontal shift module that provides a second phase shift to the output of the phase locked loop; and comparing an output of the first sample selector to an output of the third sample selector. For example, the second horizontal shift module may be the second horizontal shift module 505-2 described with reference to FIG. 5-2, and the act of comparing may be performed by the XOR unit 507-2 of FIG. 5-2.

Figure 7:
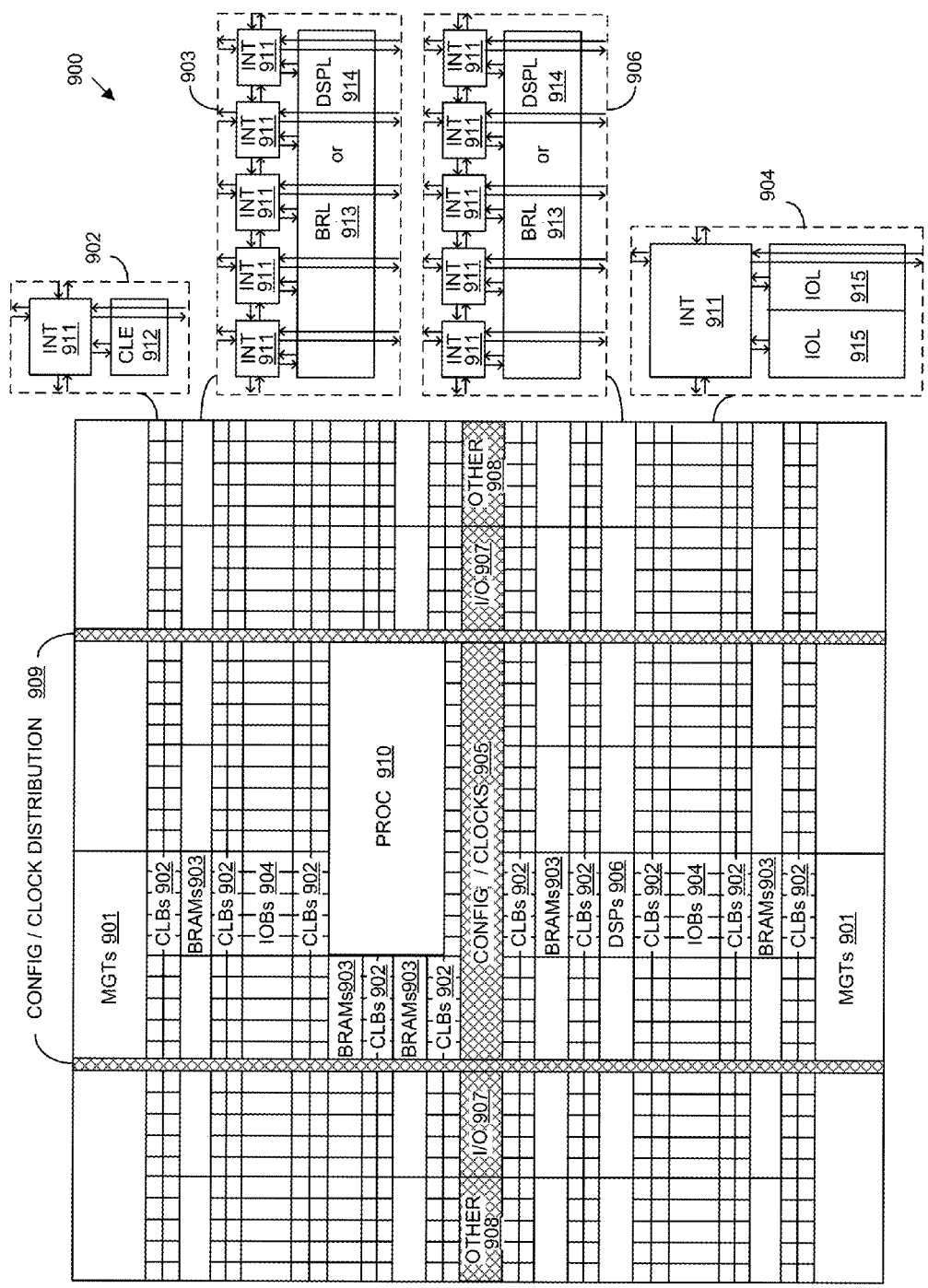
FIG. 7 is a block diagram illustrating an exemplary architecture for an integrated circuit.

In some cases, one or more features described herein, such as those described with reference to the DRU 500 of FIG. 5-1/5-2 and the method of FIG. 6, may be implemented using a FPGA. FIG. 7 is a block diagram illustrating an exemplary architecture 900 for an IC, which may implement/embody the DRU 500 or a component thereof. In one aspect, architecture 900 is implemented within a field programmable gate array (FPGA) type of IC. As shown, architecture 900 includes several different types of programmable circuit, e.g., logic, blocks. For example, architecture 900 can include a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized I/O blocks 907 (e.g., configuration ports and clock ports), and other programmable logic 908 such as digital clock managers, analog-to-digital converters, system monitoring logic, and so forth.

In some ICs, each programmable tile includes a programmable interconnect element (INT) 911 having standardized connections to and from a corresponding INT 911 in each adjacent tile. Therefore, INTs 911, taken together, implement the programmable interconnect structure for the illustrated IC. Each INT 911 also includes the connections to and from the programmable logic element within the same tile, as shown by the examples included at the top of FIG. 7.

For example, a CLB 902 can include a configurable logic element (CLE) 912 that can be programmed to implement user logic plus a single INT 911. A BRAM 903 can include a BRAM logic element (BRL) 913 in addition to one or more INTs 911. Typically, the number of INTs 911 included in a tile depends on the height of the tile. As pictured, a BRAM tile has the same height as five CLBs, but other numbers (e.g., four) also can be used. A DSP tile 906 can include a DSP logic element (DSPL) 914 in addition to an appropriate number of INTs 911. An IOB 904 can include, for example, two instances of an I/O logic element (IOL) 915 in addition to one instance of an INT 911. As will be clear to those of skill in the art, the actual I/O pads connected, for example, to IOL 915 typically are not confined to the area of IOL 915.

In the example pictured in FIG. 7, a columnar area near the center of the die, e.g., formed of regions 905, 907, and 908, can be used for configuration, clock, and other control logic. Horizontal areas 909 extending from this column are used to distribute the clocks and configuration signals across the breadth of the programmable IC.

Some ICs utilizing the architecture illustrated in FIG. 7 include additional logic blocks that disrupt the regular columnar structure making up a large part of the IC. The additional logic blocks can be programmable blocks and/or dedicated circuitry. For example, a processor block depicted as PROC 910 spans several columns of CLBs and BRAMs.

In one aspect, PROC 910 is implemented as a dedicated circuitry, e.g., as a hard-wired processor, that is fabricated as part of the die that implements the programmable circuitry of the IC. PROC 910 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 910 is omitted from architecture 900 and replaced with one or more of the other varieties of the programmable blocks described. Further, such blocks can be utilized to form a "soft processor" in that the various blocks of programmable circuitry can be used to form a processor that can execute program code as is the case with PROC 910.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 7 that are external to PROC 910 such as CLBs 903 and BRAMs 903 can be considered programmable circuitry of the IC.

In general, the functionality and connectivity of programmable circuitry are not established until configuration data is loaded into the IC. A set of configuration bits can be used to program programmable circuitry of an IC such as an FPGA. The configuration bit(s) typically is referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 910.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 7 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 7 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 910 within the IC are for purposes of illustration only and are not intended as a limitation.

In other cases, the various features described herein may be implemented in any integrated circuit, such as a general purpose processor, a microprocessor, an ASIC, or any other types of processors, which may or may not be a FPGA.

Although particular examples have been shown and described, it will be understood that it is not intended to limit the claimed inventions to the preferred examples, and it will be obvious to those skilled in the art that various changes and modifications may be made without exceeding the scope of the claimed invention. The specification and drawings are, accordingly, to be regarded in an illustrative rather than restrictive sense. The claimed inventions are intended to cover alternatives, modifications, and equivalents.

What is claimed is:

1. A data recovery unit, comprising:
   a phase locked loop configured to receive data samples and generate an output;
   a first sample selector coupled to the phase locked loop, wherein the first sample selector is configured to receive the data samples and the output of the phase locked loop; and
   an eye scanner coupled to the phase locked loop, wherein the eye scanner comprises a second sample selector coupled to the phase locked loop via a first horizontal shift module, a first XOR unit having a first input coupled to an output of the first sample selector and a second input coupled to an output of the second sample selector, and a first accumulator coupled to the first XOR unit.

2. The data recovery unit of claim 1, wherein the phase locked loop comprises:
   a phase detector;
   a low pass filter coupled to the phase detector; and
   a numerically controlled oscillator coupled to the low pass filter;
   wherein the phase detector is configured to receive the data samples and an output of the numerically controlled oscillator.

3. The data recovery unit of claim 1, wherein the first horizontal shift module is configured to provides a first phase shift.

4. The data recovery unit of claim 1, wherein the eye scanner is fully synchronized to one single clock with other components of the data recovery unit.

5. The data recovery unit of claim 1, wherein the data recovery unit is portable across different digital architectures.

6. The data recovery unit of claim 1, wherein a frequency of the first sample selector to a frequency of a line rate of the data recovery unit is fractional.

7. The data recovery unit of claim 1, wherein a frequency of the second sample selector to a frequency of a line rate of the data recovery unit is fractional.

8. The data recovery unit of claim 1, wherein the eye scanner further comprises:
   a third sample selector configured to receive the data samples, wherein the third sample selector is coupled to the output of the phase locked loop via a second horizontal shift module.

9. The data recovery unit of claim 8, wherein the second horizontal shift module is configured to provide a phase shift that is different from a phase shift provided by the first horizontal shift module.

10. The data recovery unit of claim 8, wherein the eye scanner further comprises:
    a second XOR unit having a first input coupled to an output of the first sample selector and a second input coupled to an output of the third sample selector; and
    a second accumulator coupled to the second XOR unit.

11. A data recovery unit, comprising:
    a phase locked loop configured to receive data samples and generate an output;
    a first sample selector coupled to the phase locked loop, wherein the first sample selector is configured to receive the data samples and the output of the phase locked loop; and
    an eye scanner coupled to the phase locked loop, wherein the eye scanner comprises a second sample selector coupled to the phase locked loop via a first horizontal shift module;
    wherein the phase locked loop comprises a phase detector, a low pass filter coupled to the phase detector, and a numerically controlled oscillator coupled to the low pass filter, and wherein the phase detector is configured to receive the data samples and an output of the numerically controlled oscillator; and
    wherein the numerically controlled oscillator comprises a summation module coupled to the low pass filter; and a n-bit register coupled to the summation module, and wherein the summation module is configured to receive an output of the low pass filter, an output of the n-bit register, and a center frequency value.

12. The data recovery unit of claim 11, wherein the center frequency value is configured to control a line rate at which the data recovery unit operates.

13. A method performed by a data recovery unit, comprising:
receiving data samples using a phase locked loop;
generating an output by the phase locked loop based at least in part on the data samples;
processing the output of the phase locked loop, using a first sample selector, to obtain a data recovery unit output;
transmitting the output of the phase locked loop to a second sample selector through a first horizontal shift module that provides a first phase shift to the output of the phase locked loop; and
comparing an output of the first sample selector to an output of the second sample selector.

14. The method of claim 13, wherein the act of comparing is performed by a XOR unit to identify bit errors.

15. The method of claim 14, further comprising accumulating a number of the bit errors.

16. The method of claim 13, further comprising determining a feature of an eye based on a result from the act of comparing.

17. The method of claim 16, wherein the feature comprises a width of the eye.

18. The method of claim 16, wherein the feature comprises an openness of the eye.

19. The method of claim 13, further comprising:
transmitting the output of the phase locked loop to a third sample selector through a second horizontal shift module that provides a second phase shift to the output of the phase locked loop; and
comparing an output of the first sample selector to an output of the third sample selector.

* * * * *